(12) United States Patent
Wu (10) Patent No.: US 11,044,829 B1
(45) Date of Patent: Jun. 22, 2021

(54) HEAT DISSIPATION ARCHITECTURE

(71) Applicant: Getac Technology Corporation, Hsinchu County (TW)

(72) Inventor: Chi-Jung Wu, Taipei (TW)

(73) Assignee: GETAC TECHNOLOGY CORPORATION, Hsinchu County (TW)

( * ) Notice: Subject to any disclaimer, the term of this patent is extended or adjusted under 35 U.S.C. 154(b) by 0 days.

(21) Appl. No.: 16/803,012

(22) Filed: Feb. 27, 2020

(51) Int. Cl.
*G06F 1/16* (2006.01)
*H05K 5/00* (2006.01)
*H05K 7/00* (2006.01)
*H05K 7/20* (2006.01)

(52) U.S. Cl.
CPC ..... *H05K 7/20336* (2013.01); *H05K 7/20418* (2013.01)

(58) Field of Classification Search
CPC .. H05K 7/20336; H05K 7/20418; G06F 1/20; G06F 1/203; G06F 1/206
See application file for complete search history.

(56) References Cited

U.S. PATENT DOCUMENTS

| 6,408,934 B1* | 6/2002 | Ishida | F28D 15/0233 |
| | | | 165/104.33 |
| 9,997,433 B2* | 6/2018 | Jang | H01L 23/427 |
| 10,372,168 B1* | 8/2019 | He | G06F 1/206 |
| 2015/0000872 A1* | 1/2015 | Jang | F28D 15/0275 |
| | | | 165/104.21 |

* cited by examiner

*Primary Examiner* — Anthony M Haughton
(74) *Attorney, Agent, or Firm* — Locke Lord LLP; Tim Tingkang Xia, Esq.

(57) ABSTRACT

The invention discloses a heat dissipation architecture. The heat dissipation architecture includes an electronic component, a flexible heat conductive film and a heat conductor. The flexible heat conductive film is disposed on the electronic component. The heat conductor includes a first portion and a second portion connected to the first portion. The first portion of the heat conductor is interposed in the flexible heat conductive film.

14 Claims, 14 Drawing Sheets

FIG.14

HEAT DISSIPATION ARCHITECTURE

BACKGROUND OF THE INVENTION

Field of the Invention

The invention relates to a heat dissipation architecture, and more particularly to a heat dissipation architecture having flexibility.

Description of the Prior Art

In an electronic product, when the system has a high wattage central processing unit (CPU), chip or solid state hard disk, etc., it is also necessary to configure a heat dissipation module on the device for improving its heat dissipation efficiency.

However, in the prior art, when the heat dissipation module is abutted against a component such as a CPU, the pressure which the heat dissipation module applies on the electronic component cannot be evenly distributed due to the position of the screw hole and/or the position of the locking point. It will cause the problem of the uneven attaching pressure of the heat dissipation module, and the problem of the heat dissipation efficiency.

Therefore, how to improve the heat dissipation efficiency of components such as CPU, chip or solid state disk by improving the structural design to overcome the above defects has become one of the important topics to be solved by this business.

SUMMARY OF THE INVENTION

The technical problem to be solved by the invention is to provide a heat dissipation architecture for the deficiencies of the prior art.

In order to solve the above technical problem, one of the technical solutions adopted by the invention is to provide a heat dissipation architecture including an electronic component, a flexible heat conductive film and a heat conductor. The flexible heat conductive film is disposed on the electronic component. The heat conductor includes a first portion and a second portion connected to the first portion, wherein the first portion of the heat conductor is interposed in the flexible heat conductive film.

One of the beneficial effects of the invention is that the heat dissipation architecture provided by the invention can provide technical solutions of "the flexible heat conductive film is disposed on the electronic component" and "the first portion of the heat conductor is interposed in the flexible heat conductive film" to improve the heat dissipation efficiency.

The above and other aspects of the invention will become better understood with regard to the following detailed description and drawings. However, the drawings are provided for the purpose of illustration and description only and are not intended to limit the invention

DETAILED DESCRIPTION OF THE EMBODIMENTS

The following is a description of embodiments of the invention relating to a "heat dissipation architecture" by a specific embodiment, and those skilled in the art can understand the advantages and effects of the invention from the contents disclosed in the specification. The invention can be implemented or applied in various other specific embodiments, and various modifications and changes can be made without departing from the spirit and scope of the invention. In addition, the drawings of the invention are merely illustrative and are not intended to be stated in the actual size. The following embodiments will further explain the related technical content of the invention, but the disclosure is not intended to limit the scope of the invention.

It should be understood that, although the terms "first," "second," "third," and the like may be used herein to describe various elements, these elements are not limited by these terms. These terms are primarily used to distinguish one element from another. In addition, the term "or" as used herein may include a combination of any one or more of the associated listed items, depending on the actual situation.

First Embodiment

First, please refer to FIG. 1 to FIG. 4. The first embodiment of the invention provides a heat dissipation architecture U including an electronic component 1, a flexible heat conductive film 2, and a heat conductor 3. For example, the electronic component 1 can be disposed on a carrier plate P, the flexible heat conductive film 2 can wrap the electronic component 1, and the carrier plate P can be a circuit board. In addition, in the first embodiment of the invention, the electronic component 1 can be a solid-state drive (SSD). In this embodiment, the carrier plate P is a printed circuit board (PCB), and the substrate 11 of the electronic component 1 is also a printed circuit board. The substrate 11 forms a Gold Finger or an Edge Connector on one side, and the gold finger is inserted into the carrier plate P by a board-to-board connector (not shown) fixed on the carrier plate P. However, in other embodiments, the electronic component 1 may be other electronic modules, and the invention is not limited to the form of the electronic component 1. In addition, preferably, the heat dissipation architecture U may further include a heat dissipation structure 4, the heat dissipation structure 4 may be disposed on the carrier plate P, the heat dissipation structure 4 may be disposed adjacent to the heat conductor 3, and the heat conductor 3 may be disposed between the electronic component 1 and the heat dissipation structure 4, so that the heat generated by the electronic component 1 is transferred to the heat dissipation structure 4 for heat dissipation by the heat conduction characteristics of the heat conductor 3.

As mentioned above, the heat conductor 3 may include a first portion 31 and a second portion 32 connected to the first portion 31. The first portion 31 of the heat conductor 3 may be interposed in the flexible heat conductive film 2, and the second portion 32 of the heat conductor 3 can be disposed on the heat dissipation structure 4. In addition, for example, the heat conductor 3 can be a heat pipe, and the heat dissipation structure 4 can be a heat dissipation fin made of metal, so that the heat generated by the electronic component 1 can pass through the heat conductor 3 and/or the heat dissipation structure 4 for heat dissipation. In addition, preferably, a fan (not labeled in the figure) may be further disposed adjacent to the heat dissipation structure 4 on the carrier plate P, so that the heat dissipation efficiency of the heat dissipation structure 4 can be improved by the fan. However, it should be noted that the invention is not limited by the examples set forth above.

Figure 3:
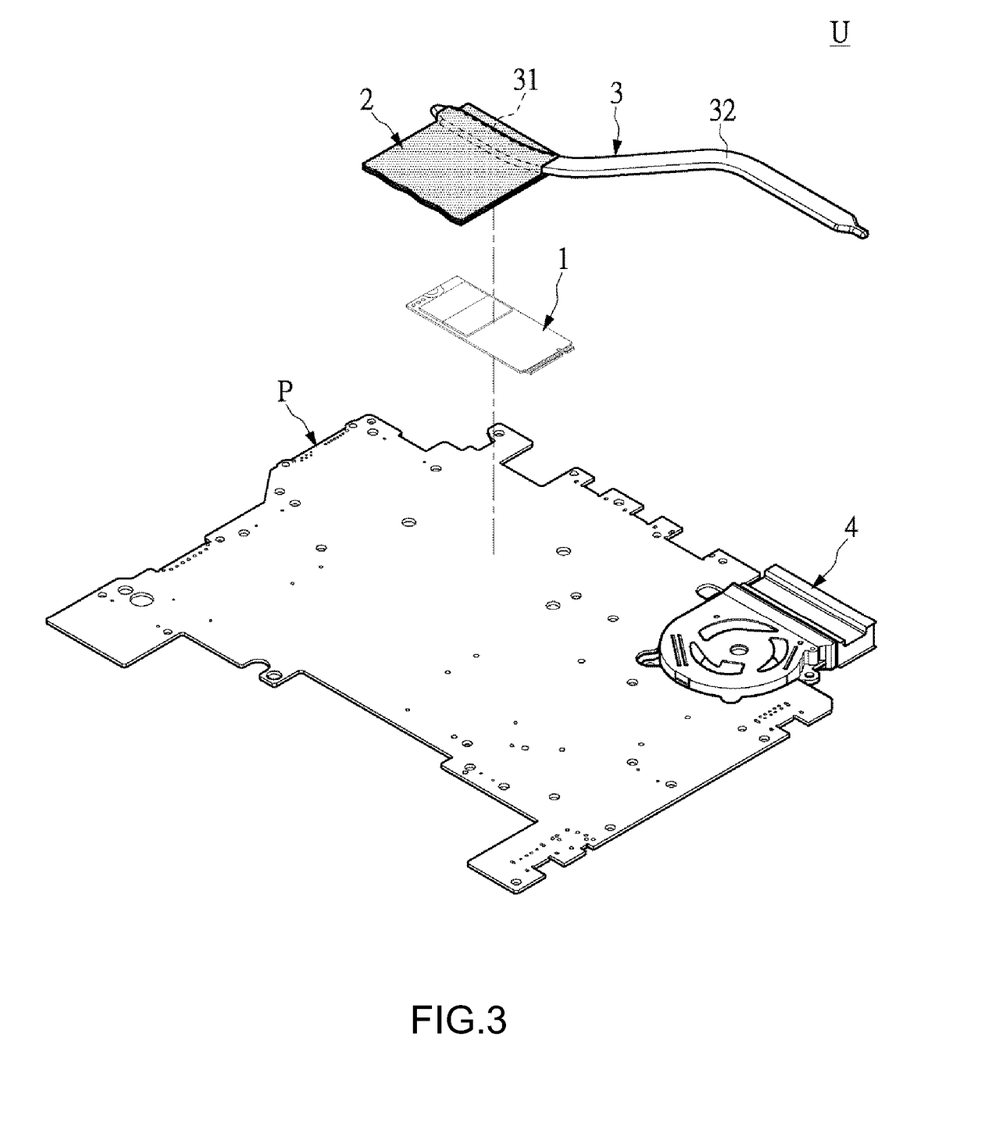
FIG. 3 is another stereoscopic decomposition schematic view of the heat dissipation architecture according to the first embodiment of the invention.
Figure 4:
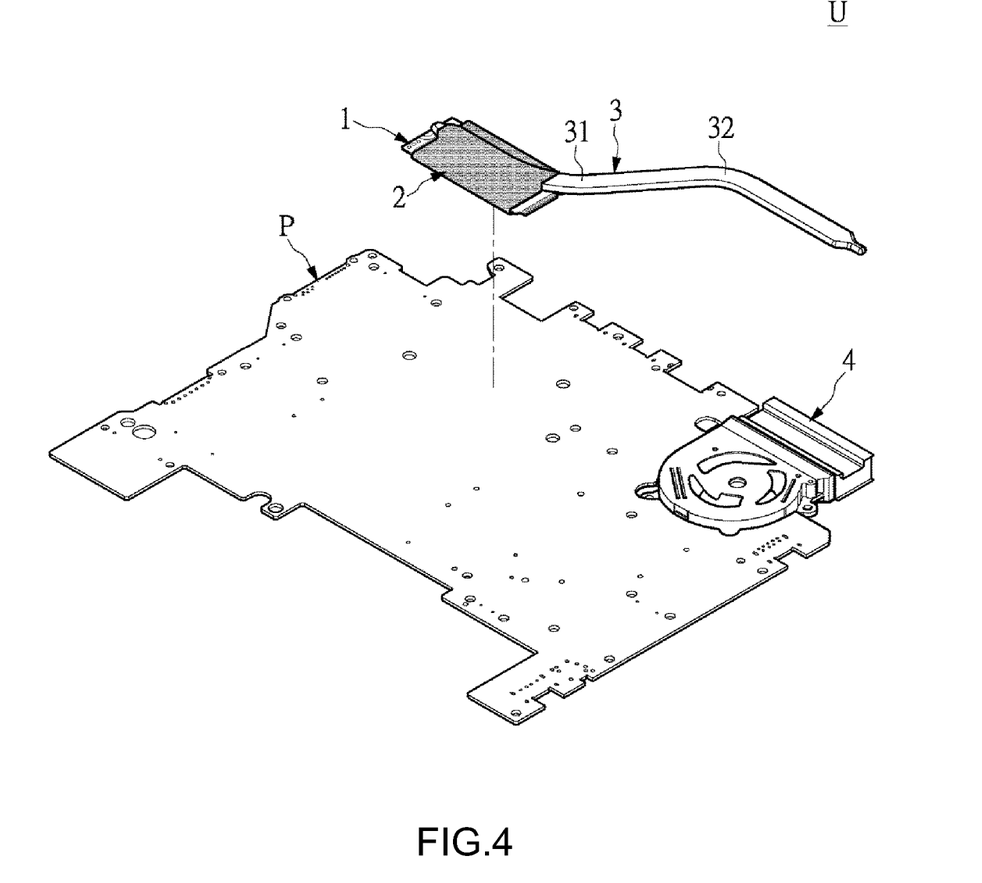
FIG. 4 is still another stereoscopic decomposition schematic view of the heat dissipation architecture according to the first embodiment of the invention.
Figure 5:
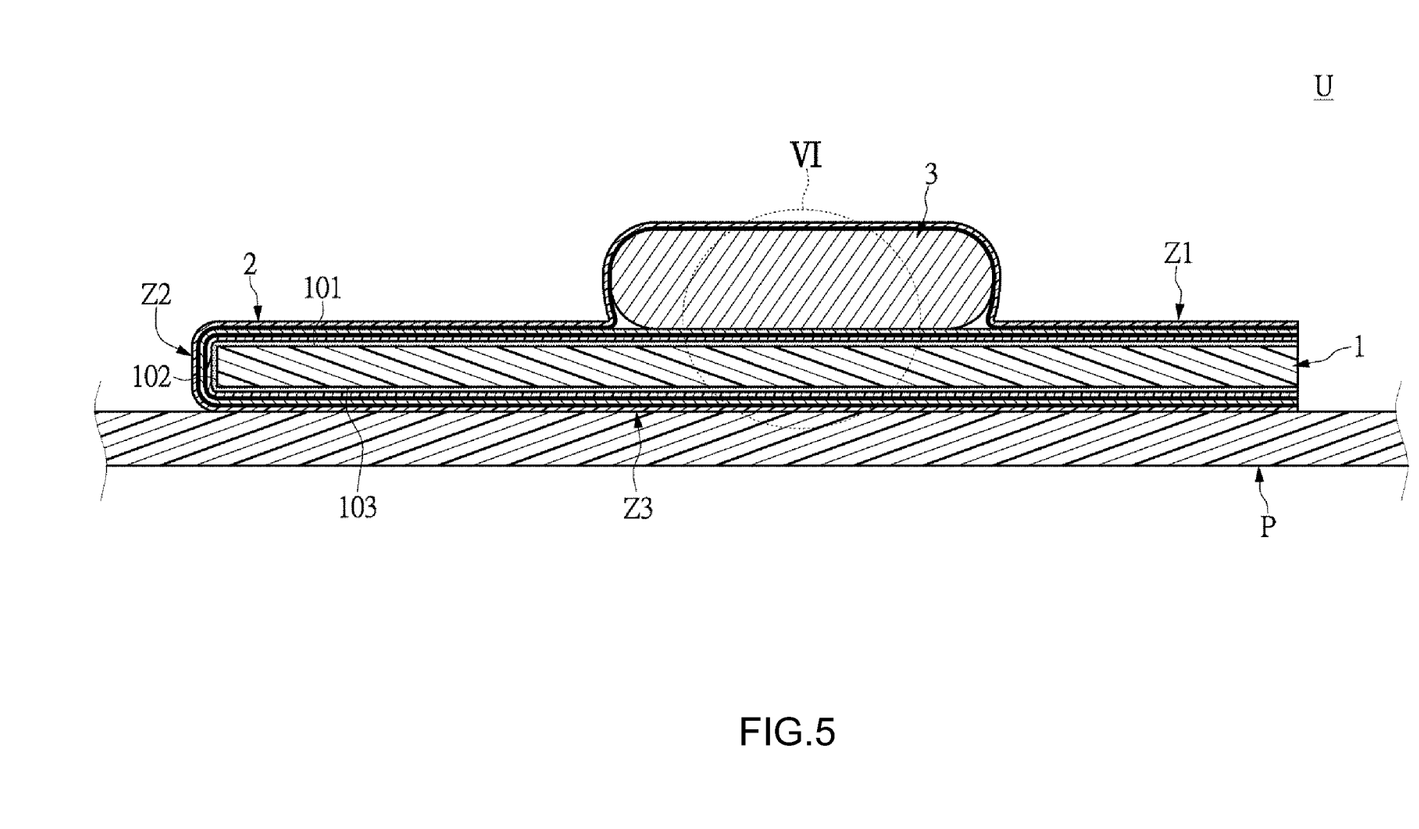
FIG. 5 is a cross-sectional schematic view showing a V-V cross section of FIG. 3.
Figure 6:
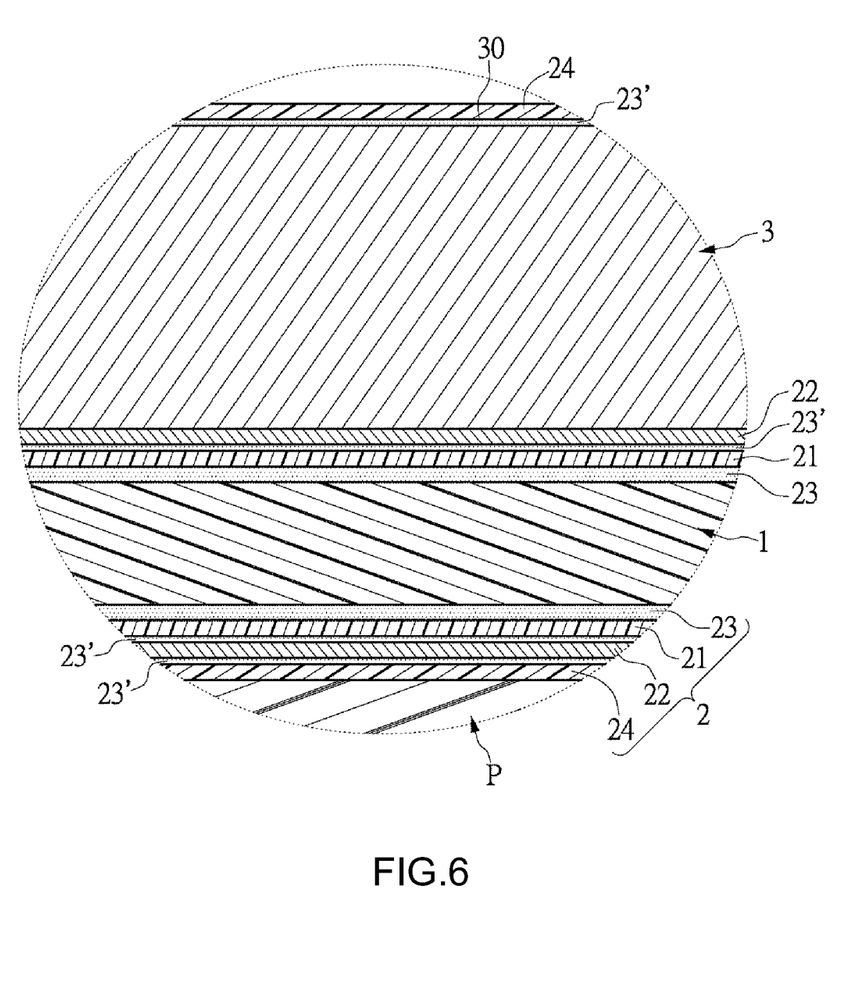
FIG. 6 is a cross-sectional schematic view showing a VI-VI cross section of FIG. 1.
Figure 7:
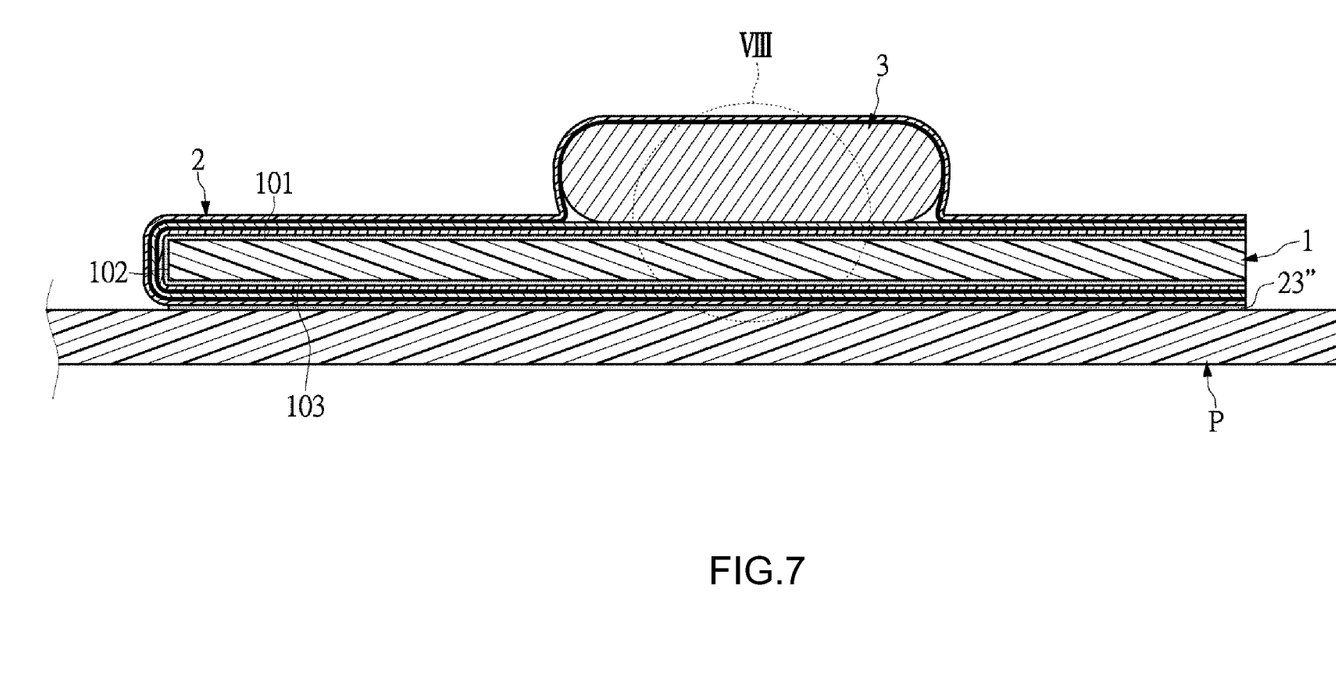
FIG. 7 is an enlarged view of the portion VII of FIG. 6.

Next, please refer to FIG. 1 to FIG. 4, and as shown in FIG. 5 to FIG. 7, the flexible heat conductive film 2 may include an adhesive layer 23, a first insulating layer 21 disposed on the adhesive layer 23, a heat conducting layer 22 disposed on the first insulating layer 21, and a second insulating layer 24 disposed on the heat conducting layer 22. The flexible heat conductive film 2 can be adhered to the electronic component 1 through the adhesive layer 23, and the first portion 31 of the heat conductor 3 can be disposed between the heat conducting layer 22 and the second insulating layer 24. Further, the heat conductor 3 may include a surrounding surface 30, and the surrounding surface 30 on the first portion 31 of the heat conductor 3 may be wrapped between the heat conducting layer 22 and the second insulating layer 24. In addition, it is to be noted that an adhesive layer 23' may be disposed between the first insulating layer 21 and the heat conducting layer 22, and the first insulating layer 21 and the heat conducting layer 22 may be combined to each other by the adhesive layer 23'. Further, an adhesive layer 23' may be disposed between the second insulating layer 24 and the heat conducting layer 22. The second insulating layer 24 and the heat conducting layer 22 may be combined to each other by the adhesive layer 23', and the first portion 31 of the heat conductor 3 may be wrapped between the heat conducting layer 22 and the second insulating layer 24.

Figure 1:
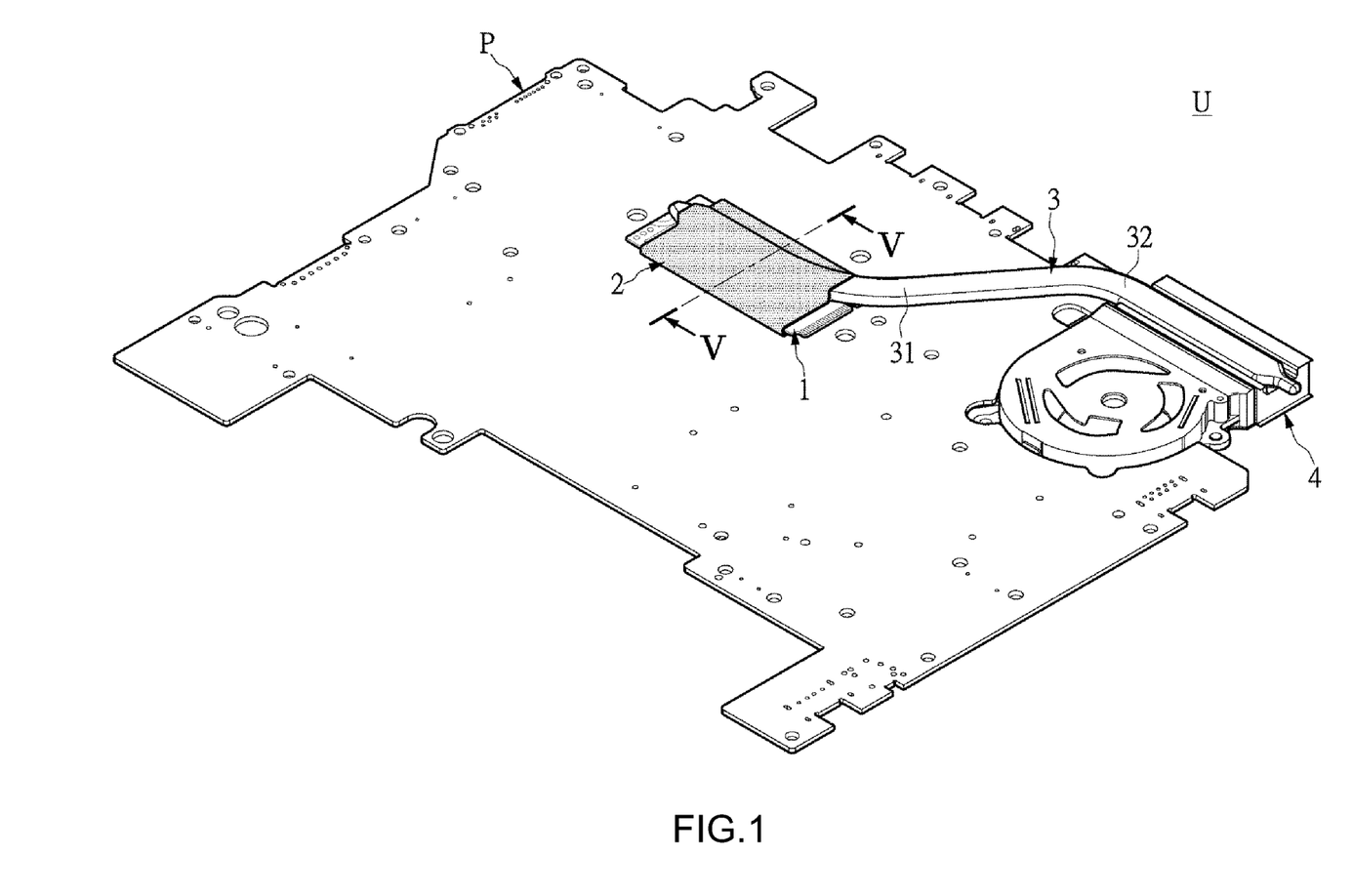
FIG. 1 is a stereoscopic combination schematic view of heat dissipation architecture according to the first embodiment of the invention.
Figure 2:
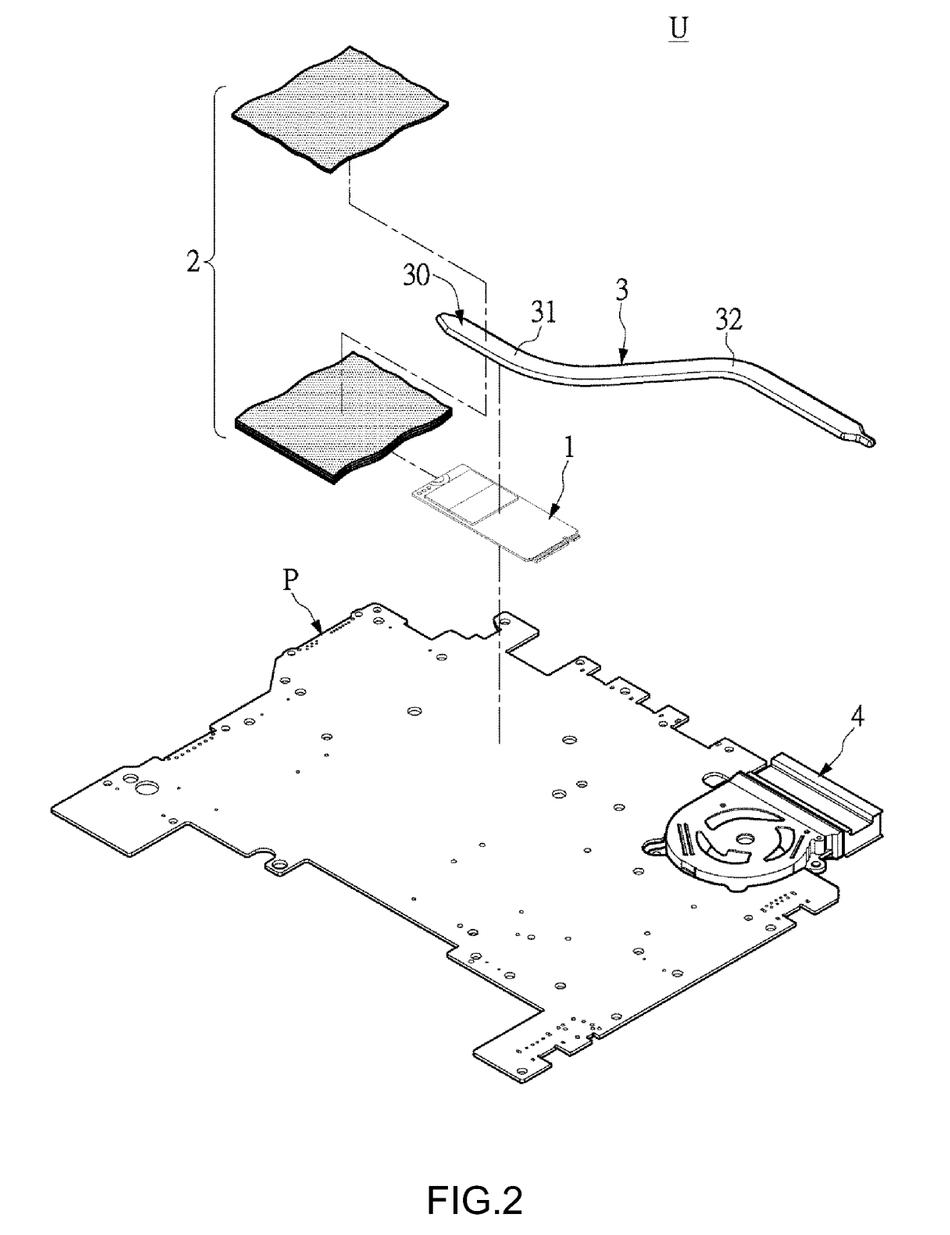
FIG. 2 is one of a stereoscopic decomposition schematic view of the heat dissipation architecture according to the first embodiment of the invention.

Next, please refer to FIG. 2 to FIG. 4, for example, in the process of combining the electronic component 1, the heat conductor 3 and the flexible heat conductive film 2, the heat conductor 3 can be first interposed in the flexible heat conductive film 2 by the flexible heat conductive film 2, and then the flexible heat conductive film 2 in which the heat conductor 3 interposed wraps the electronic component 1, and finally the above components are disposed on the carrier plate P, but the invention not limited to this.

As mentioned above, further, the electronic component 1 can include a first outer surface 101, a second outer surface 102 connected to the first outer surface 101, and a third outer surface 103 connected to the second outer surface 102, and the second outer surface 102 may connect between the first outer surface 101 and the second outer surface 102. In addition, when the flexible heat conductive film 2 wraps the electronic component 1, the flexible heat conductive film 2 may include a first region Z1 disposed on the first outer surface 101 and a second region Z2 disposed on the second outer surface 102 and a third region Z3 disposed on the third outer surface 103, and the first portion 31 of the heat conductor 3 may be disposed on the first region Z1. Further, when the electronic component 1 is disposed on the carrier plate P, the third region Z3 of the flexible heat conductive film 2 may be disposed between the carrier plate P and the electronic component 1. In other words, the flexible heat conductive film 2 may wrap the electronic component 1, for example, in a "C" shape, and the electronic component 1 that has wrapped the flexible heat conductive film 2 is disposed on the carrier plate P. In addition, the electronic component 1 that has wrapped the flexible heat conductive film 2 can be fixed on the carrier plate P by a fixed member (such as, but not limited to, a screw) or an adhesive layer, but the invention is not limited thereto.

Figure 8:
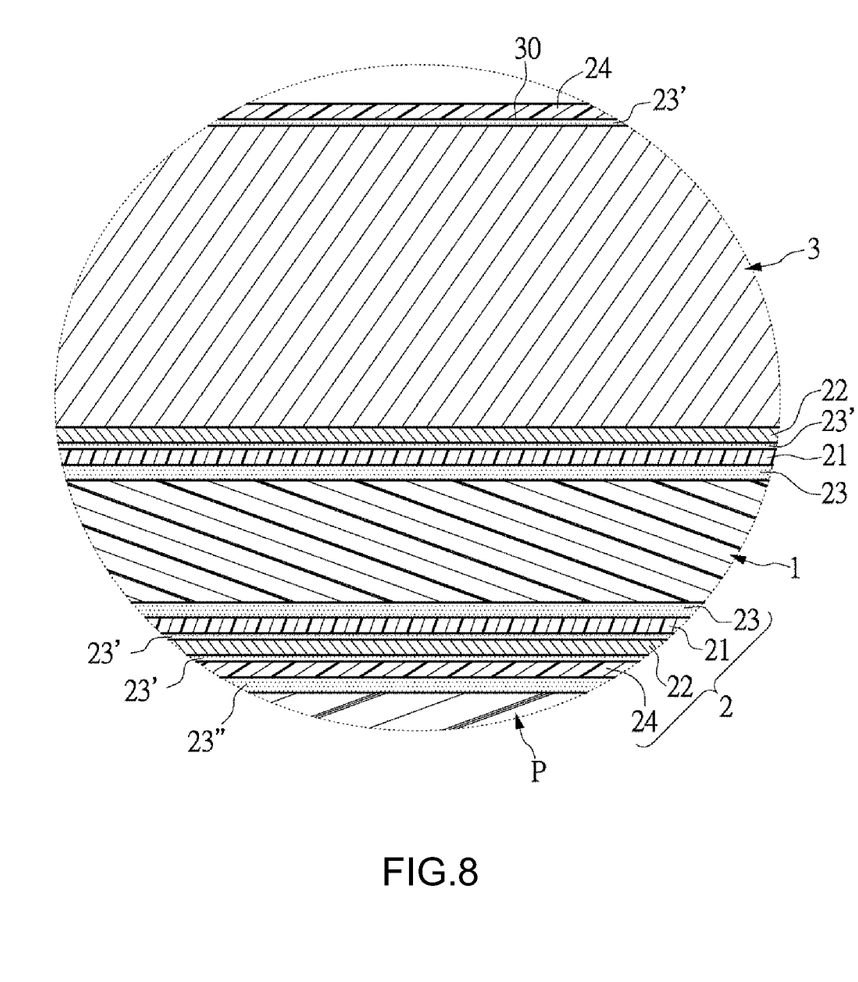
FIG. 8 is a schematic diagram of another embodiment of the heat dissipation architecture according to the first embodiment of the invention.
Figure 9:
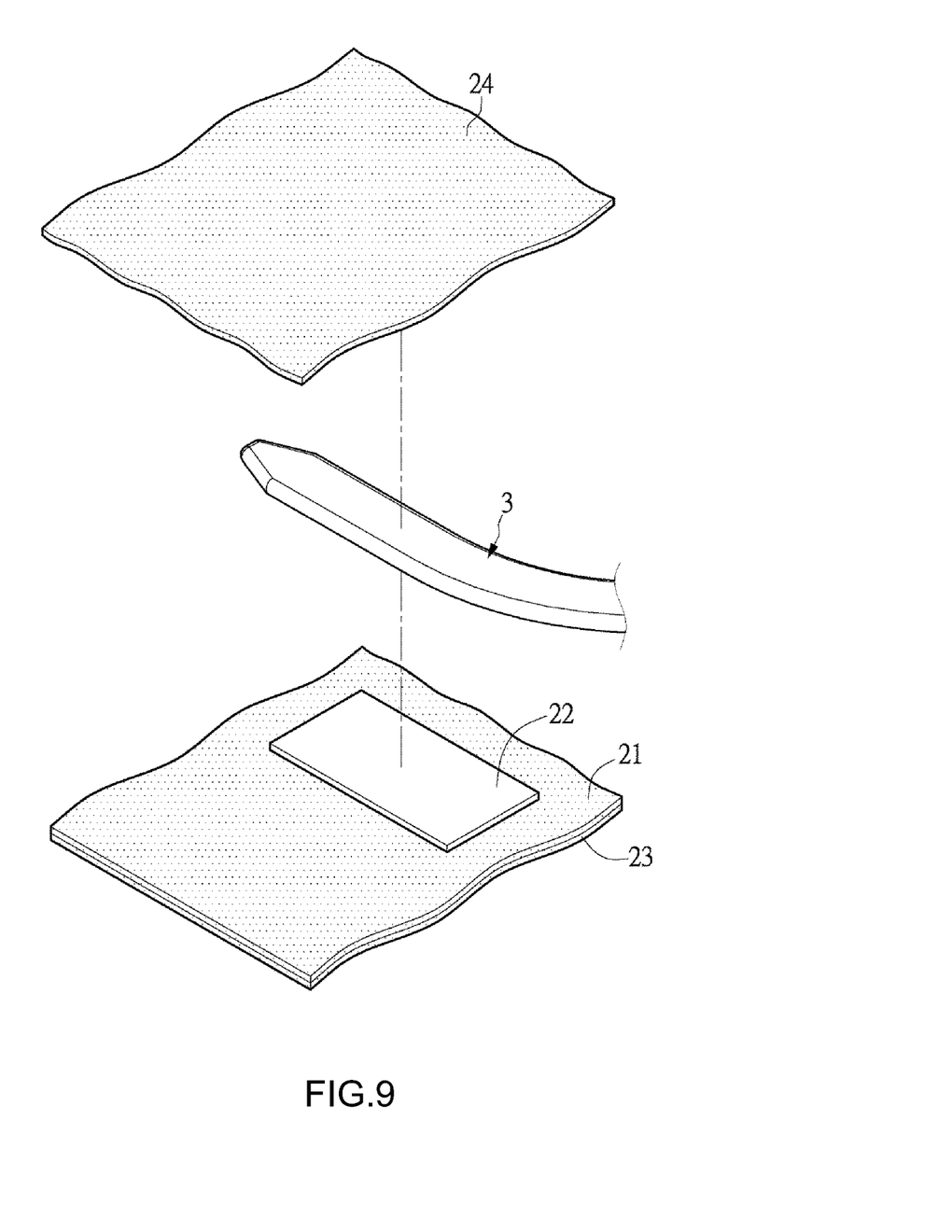
FIG. 9 is an enlarged view of the portion IX of FIG. 8.

Next, please refer to FIG. 8 and FIG. 9, it can be seen from comparison between FIG. 8 and FIG. 9 and FIG. 6 and FIG. 7, in the embodiment of FIGS. 8 and 9, the flexible heat conductive film 2 can further include an adhesive layer 23", so that the electronic component 1 that has wrapped the flexible heat conductive film 2 can be adhered to the carrier plate P by the adhesive layer 23".

As mentioned above, the adhesive layer 23" may be disposed on the second insulating layer 24 of the flexible heat conductive film 2, and the second insulating layer 24 is located between the adhesive layer 23" and the heat conducting layer 22, that is, the adhesive layer 23" may be disposed on the third region Z3 of the flexible heat conductive film 2. Thereby, the electronic component 1 that has wrapped the flexible heat conductive film 2 can be adhered to the carrier plate P by the adhesive layer 23" of the flexible heat conductive film 2.

Figure 10:
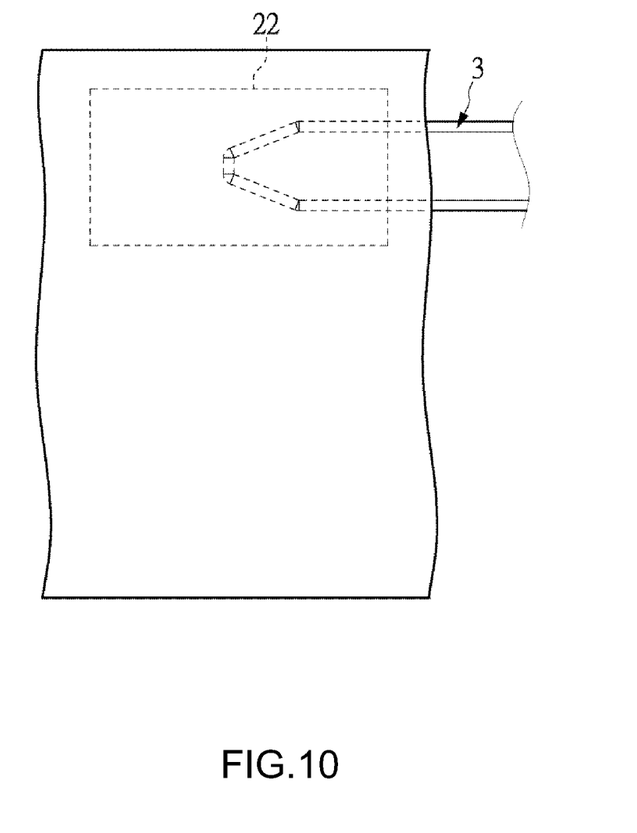
FIG. 10 is a stereoscopic decomposition schematic view of still another embodiment of the heat dissipation architecture according to the first embodiment of the invention.
Figure 11:
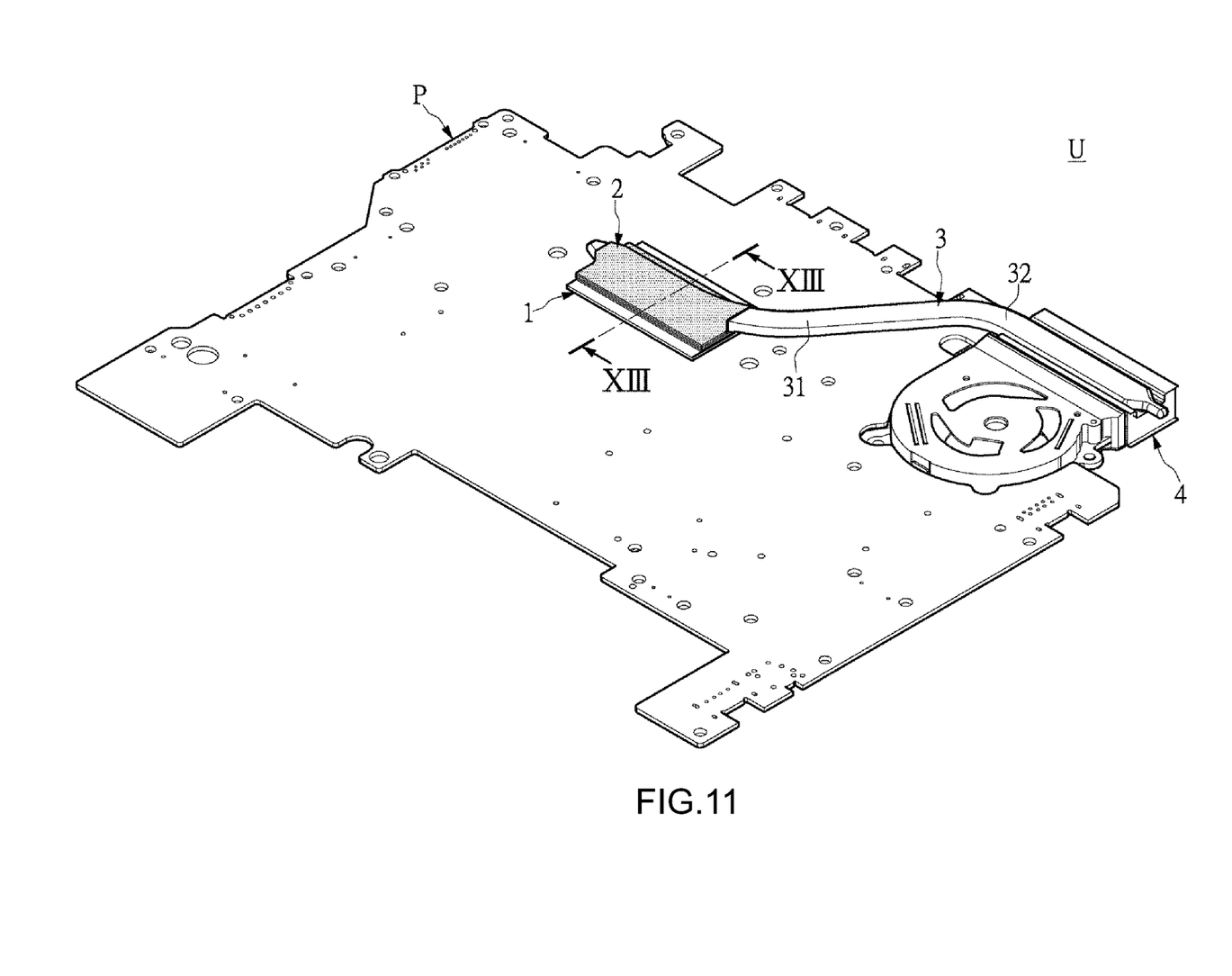
FIG. 11 is a top plan view of another embodiment of the heat dissipation architecture according to the first embodiment of the invention.

Next, please refer to FIG. 10 and FIG. 11, it can be seen from comparison between FIG. 10 and FIG. 11 and FIG. 2, in the embodiment of FIGS. 10 and 11, the size of the heat conducting layer 22 may smaller than the size of the first insulating layer 21 and the second insulating layer 24. Thereby, as shown in FIG. 11, the edges of the first insulating layer 21 and the second insulating layer 24 may be attached to each other, such that the heat conducting layer 22 may be enclosed between the first insulating layer 21 and the second insulating layer 24 to form a flexible heat conductive film 2 with fully sealed edge.

As mentioned above, for example, the material of the first insulating layer 21 may include polyethylene terephthalate (PET) or the material of the first insulating layer 21 is polyethylene terephthalate, and the color of the first insulating layer 21 may be black. Further, the heat conducting layer 22 may be selected from the group consisting of aluminum, silver, copper, and graphene. Further, for example, the thickness of the heat conducting layer 22 may be about 0.1 millimeters (mm), and the thickness of the first insulating layer 21 may be between 0.01 mm and 0.03 mm. In addition, for example, the material of the adhesive layer 23 may be a general or special adhesive. However, it should be noted that the invention is not limited by the examples set forth above.

As mentioned above, for example, the material of the second insulating layer 24 may include polyethylene terephthalate or the material of the second insulating layer 24 is polyethylene terephthalate, and the color of the second insulating layer 24 may be black. Further, the thickness of the second insulating layer 24 may be between 0.01 mm and 0.03 mm. However, it should be noted that the invention is not limited by the examples set forth above. In addition, it should be noted that the exposed surface (not labeled in the figure) of the second insulating layer 24 may also be a rough exposed surface so that the heat dissipation efficiency can be improved.

Thereby, since the heat conductor 3 is interposed in the flexible heat conductive film 2, and the positioning manner between the heat conductor 3 and the electronic component 1 is that the heat conductor 3 and the electronic component 1 are combined to each other by the flexible heat conductive film 2 with flexibility, therefore the flexible heat conductive film 2 can cover on the electronic component 1 in accordance with the outline of the electronic component 1, so that the heat dissipation efficiency can be improved.

Second Embodiment

Figure 12:
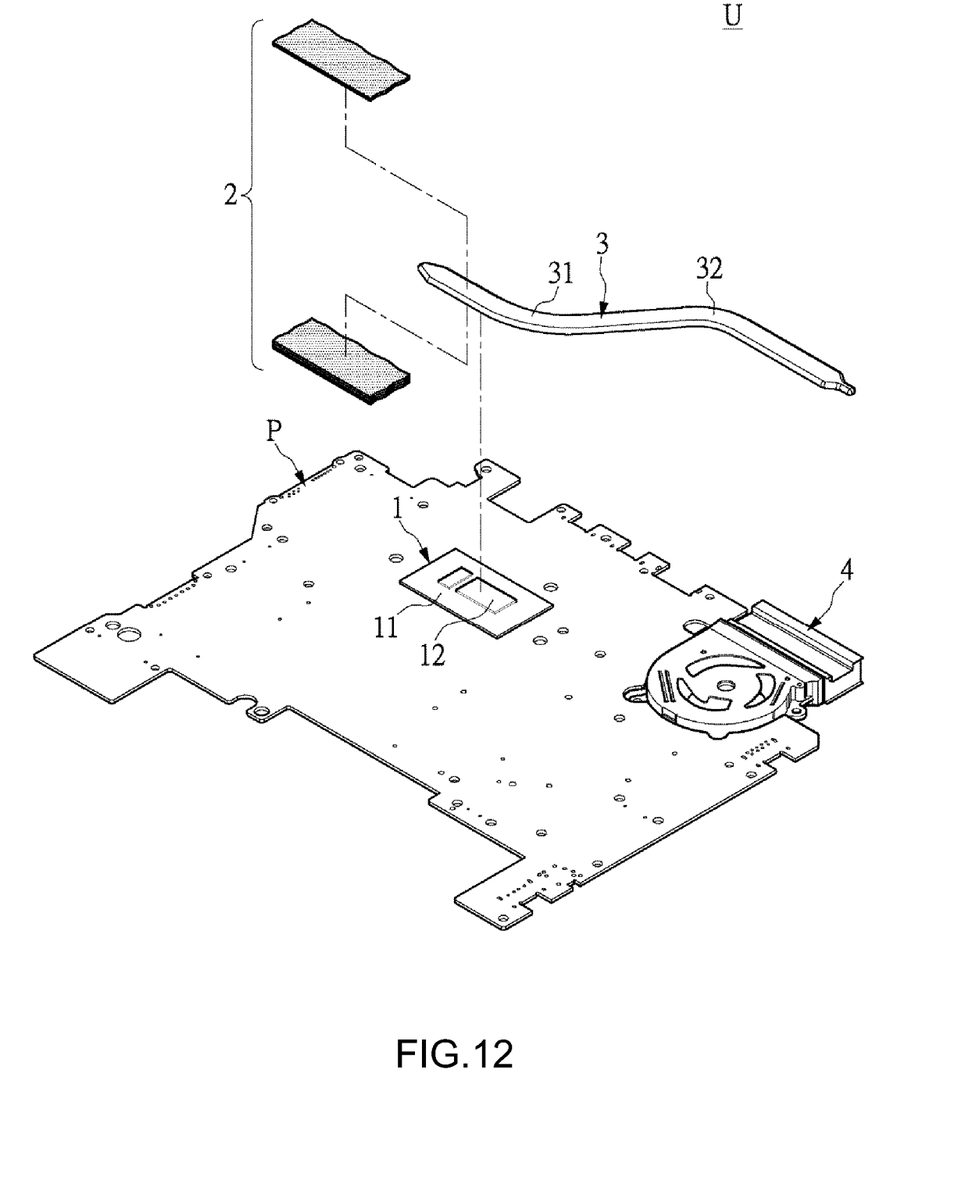
FIG. 12 is a stereoscopic combination schematic view of heat dissipation architecture according to the second embodiment of the invention.
Figure 13:
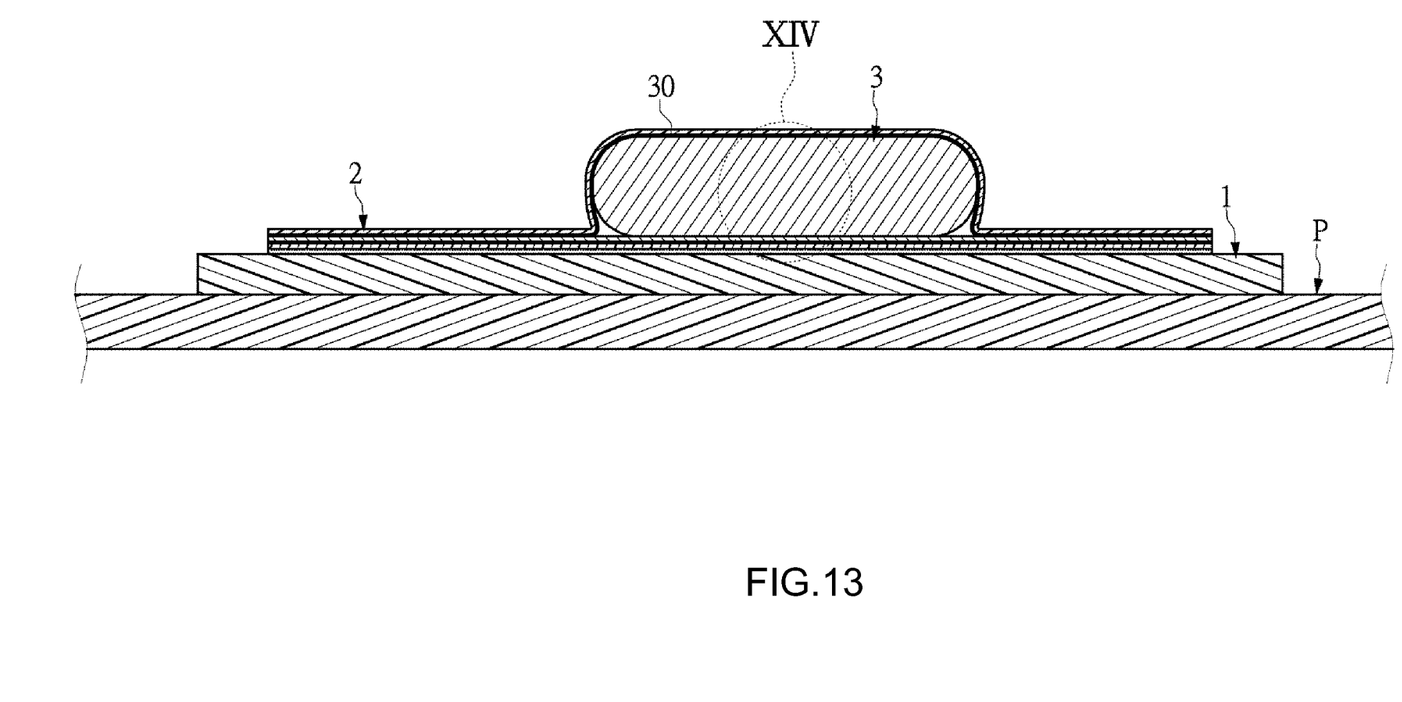
FIG. 13 is a stereoscopic decomposition schematic view of the heat dissipation architecture according to the second embodiment of the invention.

First, please refer to FIG. 12 and FIG. 13. The second embodiment of the invention provides a heat dissipation architecture U including an electronic component 1, a flexible heat conductive film 2, and a heat conductor 3. In addition, the electronic component 1 may be disposed on a carrier plate P. For example, the electronic component 1 may include a substrate 11 disposed on the carrier plate P and a chip 12 disposed on the substrate 11, and the carrier plate P and the substrate 11 may be a circuit board respectively. In addition, preferably, the heat dissipation architecture U may further include a heat dissipation structure 4, the heat dissipation structure 4 may be disposed on the carrier plate P, the heat dissipation structure 4 may be disposed adjacent to the heat conductor 3, and the heat conductor 3 may abut against between the electronic component 1 and the heat dissipation structure 4, so that the heat generated by the electronic component 1 can be transferred to the heat dissipation structure 4 for heat dissipation by the heat conduction characteristics of the heat conductor 3. Further, the flexible heat conductive film 2 may be disposed on the chip 12 of the electronic component 1, the heat conductor 3 may include a first portion 31 and a second portion 32 connected to the first portion 31, the first portion 31 of the heat conductor 3 may be interposed in the flexible heat conductive film 2, and the second portion 32 of the heat conductor 3 may be disposed on the heat dissipation structure 4. In addition, it should be noted that other structures of the heat dissipation architecture U provided in the second embodiment are similar to those of the foregoing first embodiment, and details are not described herein again.

Figure 14:
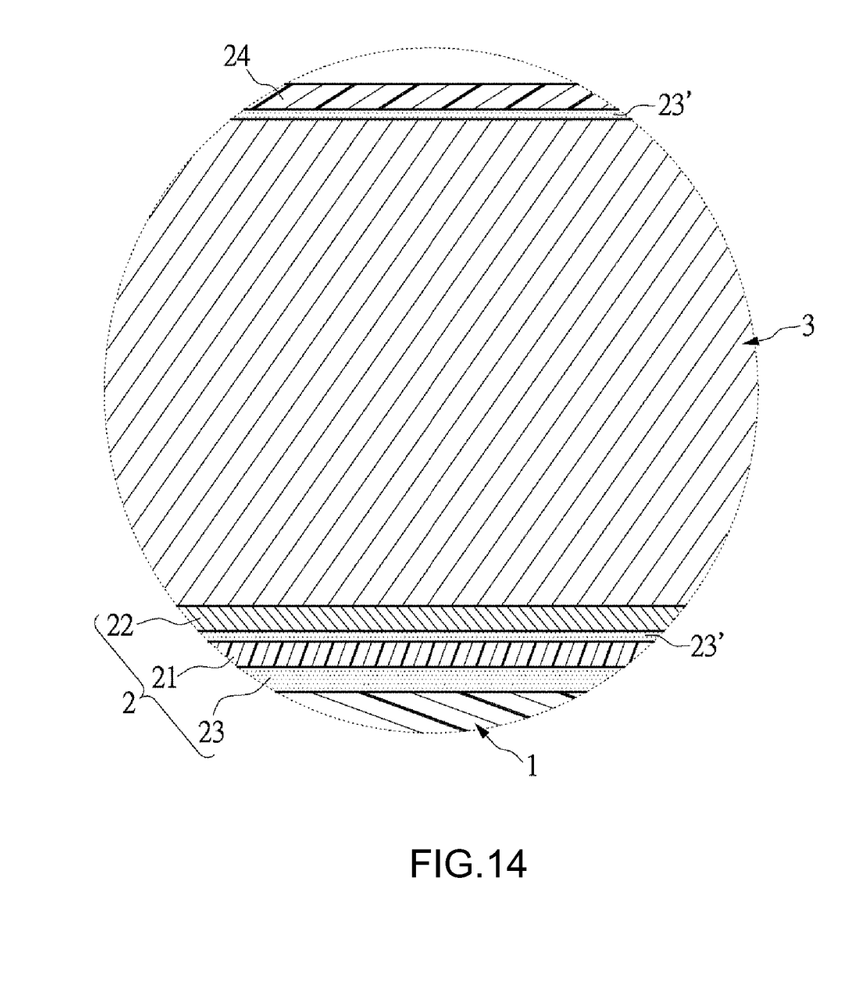
FIG. 14 is a cross-sectional schematic view of the XIV-XIV cross section of FIG. 12.

Next, please refer to FIG. 14, the flexible heat conductive film 2 may include a first insulating layer 21 disposed on the electronic component 1 and a heat conducting layer 22 disposed on the first insulating layer 21, the first portion 31 of the heat conductor 3 may be disposed on the heat conducting layer 22 of the flexible heat conductive film 2. Preferably, the flexible heat conductive film 2 may further include an adhesive layer 23 and a second insulating layer 24. The adhesive layer 23 may be disposed on the first insulating layer 21, and the first insulating layer 21 may be located between the adhesive layer 23 and the heat conductive layer 22. The flexible heat conductive film 2 may be adhered to the electronic component 1 by the adhesive layer 23. Further, the second insulating layer 24 may be disposed on the heat conducting layer 22, and the first portion 31 of the heat conductor 3 may be disposed between the heat conducting layer 22 and the second insulating layer 24. Further, the heat conductor 3 may include a surrounding surface 30, and the surrounding surface 30 on the first portion 31 of the heat conductor 3 may be wrapped between the heat conducting layer 22 and the second insulating layer 24.

As mentioned above, it should be noted that an adhesive layer 23' may be disposed between the first insulating layer 21 and the heat conducting layer 22, and the first insulating layer 21 and the heat conducting layer 22 may be combined to each other by the adhesive layer. In addition, the adhesive layer 23' may be disposed between the heat conducting layer 22 and the second insulating layer 24, and the heat conducting layer 22 and the second insulating layer 24 may be combined to each other by the adhesive layer 23'. Further, the adhesive layer 23' may be disposed between the first portion 31 of the heat conductor 3 and the heat conducting layer 22 and the second insulating layer 24, and the first portion 31 of the heat conductor 3 and the heat conducting layer 22 and the second insulating layer 24 can be combined to each other by the adhesive layer 23'. However, in other embodiments, the heat conductor 3 may first be disposed on the heat conducting layer 22 by soldering, and then the second insulating layer 24 may be disposed on the heat conductor 3 by the adhesive layer, so that the first portion 31 of the body 3 may be disposed between the heat conducting layer 22 and the second insulating layer 24.

Advantageous Effects of Embodiments

One of the advantageous effects of the invention is that the heat dissipation architecture U provided by the invention can provide technical solutions of "the flexible heat conductive film 2 is disposed on the electronic component 1" and "the first portion 31 of the heat conductor 3 is interposed in the flexible heat conductive film 2" to improve the heat dissipation efficiency.

Further, the flexible heat conductive film 2 may utilize the material properties of the first insulating layer 21, the second insulating layer 24, and/or the heat conducting layer 22, so that the flexible heat conductive film 2 has flexibility. Therefore, the flexible heat conductive film 2 can be tightly wrapped or attached to the electronic component 1, and the heat dissipation efficiency can be improved.

Further, the flexible heat conductive film 2 may wrap the electronic component 1, for example, in a "C" shape, so it can improve the process convenience of attachment between the flexible heat conductive film 2 and the electronic component 1.

The above disclosure is only a preferred embodiment of the invention, and is not intended to limit the scope of the invention. Therefore, any equivalent technical changes made by using the specification and the contents of the drawings of the invention are included in the scope of the patent application of the invention.

What is claimed is:

1. A heat dissipation architecture comprising:
an electronic component;
a flexible heat conductive film, the flexible heat conductive film disposed on the electronic component, wherein the flexible heat conductive film includes a first insulating layer disposed on the electronic component, a heat conducting layer disposed on the first insulating layer, and a second insulating layer disposed on the heat conducting layer; and a heat conductor, the heat conductor comprising a first portion and a second portion connected to the first portion, wherein the first portion of the heat conductor is interposed in the flexible heat conductive film, and the first portion of the heat conductor is disposed between the heat conducting layer and the second insulating layer.

2. The heat dissipation architecture according to claim 1, further comprising:
a heat dissipation structure, the heat dissipation structure disposed adjacent to the heat conductor, and the second portion of the heat conductor disposed on the heat dissipation structure.

3. The heat dissipation architecture according to claim 1, wherein the heat conductor is a heat pipe.

4. The heat dissipation architecture according to claim 1, wherein the material of the first insulating layer includes the polyethylene terephthalate.

5. The heat dissipation architecture according to claim 1, wherein the heat conducting layer is selected from the group consisting of aluminum, silver, copper, and grapheme.

6. The heat dissipation architecture according to claim 1, wherein the heat conductor further includes a surrounding surface, the surrounding surface on the first portion of the heat conductor is wrapped between the heat conducting layer and the second insulating layer.

7. The heat dissipation architecture according to claim 1, wherein the flexible heat conductive film further includes an adhesive layer, the adhesive layer is disposed on the first insulating layer, and the first insulating layer is located between the adhesive layer and the heat conducting layer, and the flexible heat conductive film is adhered to the electronic component by the adhesive layer.

8. The heat dissipation architecture according to claim 1, wherein
the material of the second insulating layer includes the polyethylene terephthalate.

9. The heat dissipation architecture according to claim 1, wherein the electronic component includes a first outer surface, a second outer surface connected to the first outer surface, and a third outer surface connected to the second outer surface, and the second outer surface is connected between the first outer surface and the second outer surface, wherein the flexible heat conductive film includes a first region disposed on the first outer surface and a second region disposed on the second outer surface and a third region disposed on the third outer surface, the first portion of the heat conductor is disposed on the first region.

10. The heat dissipation architecture according to claim 9, further comprising: a carrier plate, the electronic component disposed on the carrier plate, and the third region of the flexible heat conductive film disposed between the carrier plate and the electronic component.

11. A heat dissipation architecture comprising:
an electronic component, wherein the electronic component includes a first outer surface, a second outer surface connected to the first outer surface, and a third outer surface connected to the second outer surface, and the second outer surface is connected between the first outer surface and the second outer surface;

a flexible heat conductive film, the flexible heat conductive film disposed on the electronic component, wherein the flexible heat conductive film includes a first region disposed on the first outer surface and a second region disposed on the second outer surface and a third region disposed on the third outer surface; and a heat conductor, the heat conductor comprising a first portion and a second portion connected to the first portion, wherein the first portion of the heat conductor is interposed in the flexible heat conductive film, and the first portion of the heat conductor is disposed on the first region.

12. The heat dissipation architecture according to claim 11, further comprising: a carrier plate, the electronic component disposed on the carrier plate, and the third region of the flexible heat conductive film disposed between the carrier plate and the electronic component.

13. The heat dissipation architecture according to claim 11, further comprising:
a heat dissipation structure, the heat dissipation structure disposed adjacent to the heat conductor, and the second portion of the heat conductor disposed on the heat dissipation structure.

14. The heat dissipation architecture according to claim 11, wherein the heat conductor is a heat pipe.

* * * * *